(12) United States Patent
Hattori et al.

(10) Patent No.: US 9,007,051 B2
(45) Date of Patent: Apr. 14, 2015

(54) ELECTRIC CURRENT DETECTION CIRCUIT

(75) Inventors: Takeshi Hattori, Okazaki (JP);
Kazunori Ozawa, Chiryu (JP); Fukuo Ishikawa, Kariya (JP); Nobutomo Takagi, Okazaki (JP)

(73) Assignee: Anden Co., Ltd., Anjo (JP)

( * ) Notice: Subject to any disclaimer, the term of this patent is extended or adjusted under 35 U.S.C. 154(b) by 220 days.

(21) Appl. No.: 13/568,500

(22) Filed: Aug. 7, 2012

(65) Prior Publication Data

US 2013/0049737 A1 Feb. 28, 2013

(30) Foreign Application Priority Data

Aug. 31, 2011 (JP) .................................. 2011-189176

(51) Int. Cl.
*G01R 19/00* (2006.01)
*G01R 19/165* (2006.01)
*G01R 19/25* (2006.01)

(52) U.S. Cl.
CPC ...... *G01R 19/16571* (2013.01); *G01R 19/2513* (2013.01)

(58) Field of Classification Search
CPC ...................... G01R 19/2513; G01R 19/16571
USPC ........................................................ 324/76.11
See application file for complete search history.

(56) References Cited

U.S. PATENT DOCUMENTS

| 6,857,093 B2 * | 2/2005 | Ooishi ........................... 714/733 |
| 7,498,798 B2 * | 3/2009 | Chang ........................ 324/76.11 |
| 2007/0164723 A1 * | 7/2007 | Yanagisawa ............... 324/76.11 |
| 2011/0216448 A1 | 9/2011 | Hisada et al. |
| 2013/0027236 A1 | 1/2013 | Yamase et al. |

FOREIGN PATENT DOCUMENTS

| JP | 05-026908 A | 2/1993 |
| JP | 09-326699 A | 12/1997 |
| JP | 2006-246267 A | 9/2006 |
| JP | A-2009-142146 | 6/2009 |

OTHER PUBLICATIONS

Office Action mailed on Jun. 3, 2014 in corresponding JP Application No. 2011-189176 (with English Translation).

* cited by examiner

*Primary Examiner* — Arleen M Vazquez
*Assistant Examiner* — Robert P Alejnikov, Jr.
(74) *Attorney, Agent, or Firm* — Posz Law Group, PLC

(57) ABSTRACT

An electric current detection circuit for detecting an electric current flowing to a load includes a voltage generation circuit, a plurality of comparators, and a reference voltage shift circuit. The voltage generation circuit includes a plurality of resistors coupled in series and generates different voltages by dividing a reference voltage with the resistors. The comparators determine a current level of the electric current flowing to the load using the voltages generated by the voltage generation circuit as threshold values. The reference voltage shift circuit shifts the reference voltage. The electric current flowing to the load is detected based on the current level determined by the plurality of comparators before shifting the reference voltage and the current level determined by the plurality of comparators after shifting the reference voltage.

4 Claims, 12 Drawing Sheets

FIG. 6

| TERMINAL | DETERMINATION PART | SETTING1 (0.5sq) | SETTING2 (0.75sq) | SETTING3 (0.85sq) | SETTING4 (1.25sq) | EXPRESSION FOR CALCULATING DETECTION CURRENT VALUE |
|---|---|---|---|---|---|---|
| | | | | | | SEMICONDUCTOR SWITCH ALLOWABLE ENERGIZATION CURRENT VALUE |
| ch1 | ID1 | 80A | 80A | 80A | 80A | |
| ch2 | ID2 | 39.6A | 50.9A | 59.4A | 73.5A | $Z \times \sqrt{32}$ |
| ch3 | ID3 | 28A | 36A | 42A | 52A | $Z \times \sqrt{16}$ |
| ch4 | ID4 | 19.8A | 25.5A | 29.7A | 36.8A | $Z \times \sqrt{8}$ |
| ch5 | ID5 | 14A | 18A | 21A | 26A | $Z \times \sqrt{4}$ |
| ch6 | ID6 | 9.9A | 12.7A | 14.8A | 18.4A | $Z \times \sqrt{2}$ |
| | ID7 | 7A | 9A | 10.5A | 13A | Z (WIRE ALLOWABLE CURRENT VALUE) |
| | ID8 | 6.7A | 8.6A | 10A | 12.4A | $Z \times 0.95$ |

FIG. 7

| | BEFORE SHIFTING | | | AFTER SHIFTING (1ms LATER) | | | |
|---|---|---|---|---|---|---|---|
| DETERMINATION PART | CURRENT THRESHOLD VALUE | INTEGRATION VALUE | | DETERMINATION PART | CURRENT THRESHOLD VALUE | INTEGRATION VALUE | SUM OF INTEGRATION VALUE |
| ID1 | 80A | 64 | | ID1 | 80A | 64 | 128 |
| ID2 | 50.9A | 32 | | ID2 | 62.4A | 32 | 96 |
| ID3 | 36A | 16 | | ID3 | 44.1A | 16 | 64 |
| ID4 | 25.5A | 8 | | ID4 | 31.2A | 8 | 48 |
| ID5 | 18A | 4 | | ID5 | 22A | 4 | 32 |
| ID6 | 12.7A | 2 | | ID6 | 15.6A | 2 | 24 |
| ID7 | 9A | 0 | | ID7 | 11A | 0 | 16 |
| ID8 | 6.6A | −1 OR −2 | | ID8 | 10.5A | −1 OR −2 | 12 |
| | | | | | | | 8 |
| | | | | | | | 6 |
| | | | | | | | 4 |
| | | | | | | | 2 |
| | | | | | | | 0 |
| | | | | | | | ONE OF −1 TO −4 |

PRIOR ART

ELECTRIC CURRENT DETECTION CIRCUIT

CROSS REFERENCE TO RELATED APPLICATIONS

The present application is based on and claims priority to Japanese Patent Application No, 2011-189176 filed on Aug. 31, 2011, the contents of which are incorporated in their entirety herein by reference.

TECHNICAL FIELD

The present disclosure relates to an electric current detection circuit for detecting an electric current flowing to a load.

BACKGROUND

JP-A-2009-142146 discloses a power supply device that calculates a square current value of a detection value proportional to a current value flowing to a semiconductor switch coupled with an electric wire, compares a temperature rise corresponding value of the electric wire obtained from the square current value with an abnormality determination value, and turns off the semiconductor switch when the temperature rise corresponding value exceeds the abnormality determination value.

In the power supply device, a transitional thermal change of a heat flow rate corresponding to a thermal change of the semiconductor switch is expressed by a predetermined logical expression, and the logical expression is calculated by a digital operation.

SUMMARY

It is an object of the present disclosure to provide a current detection circuit that can detect an electric current flowing to a load with a high resolution.

According to an aspect of the present disclosure, an electric current detection circuit for detecting an electric current flowing to a load includes a voltage generation circuit, a plurality of comparators, and a reference voltage shift circuit. The voltage generation circuit includes a plurality of resistors coupled in series, and generates different voltages by dividing a reference voltage with the resistors. The comparators determine a current level of the electric current flowing to the load using the voltages generated by the voltage generation circuit as threshold values. The reference voltage shift circuit shifts the reference voltage. The electric current flowing to the load is detected based on the current level determined by the plurality of comparators before shifting the reference voltage and the current level determined by the plurality of comparators after shifting the reference voltage.

BRIEF DESCRIPTION OF THE DRAWINGS

Additional objects and advantages of the present disclosure will be more readily apparent from the following detailed description when taken together with the accompanying drawings. In the drawings:

FIG. 6 is a diagram showing an example of current threshold values of copper wire harnesses;

FIG. 7 is a diagram showing a relationship between current threshold values and integration values before and after shifting at a setting 2 in FIG. 6;

DETAILED DESCRIPTION

Before describing embodiments of the present disclosure, difficulties which the inventors of the present application found will be described below.

The above-described conventional technique requires a microcomputer and a peripheral circuit for performing the digital operation of the transitional thermal change of the heat flow rate based on the logical expression. Thus, a circuit for protecting the semiconductor switch may be complicated.

Consequently, an electric current flowing into a load may be periodically detected by an overcurrent detection circuit, a square current value proportional to a current value detected by the overcurrent detection circuit may be calculated, and the electric current flowing to the load may be interrupted when a temperature rise corresponding value of an electric wire obtained from the square current value exceeds a determination value, thereby protecting the wire and the load against an overcurrent.

Figure 12:
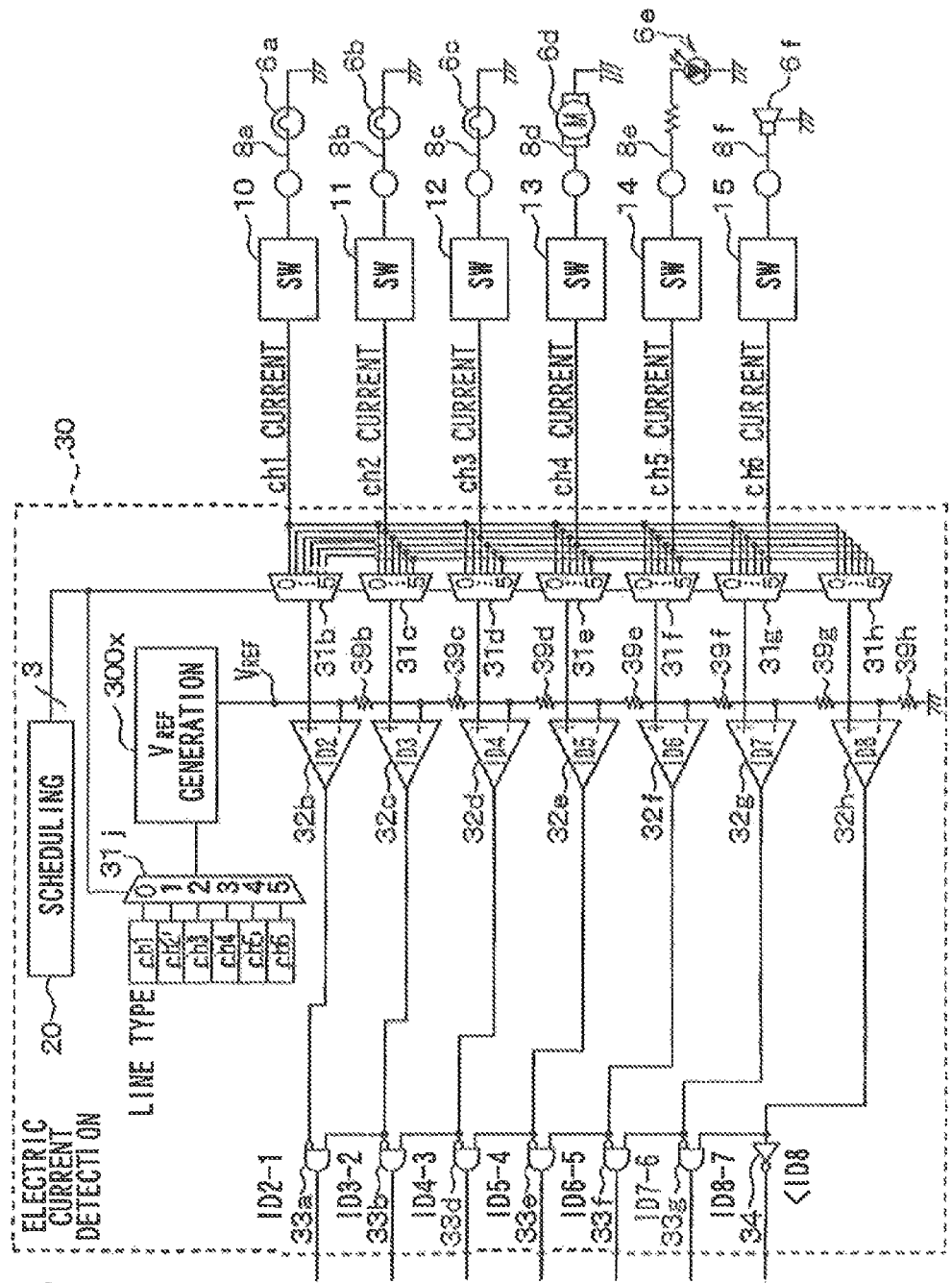
FIG. 12 is a diagram showing an electric current detection circuit according to a related art.
Figure 13:
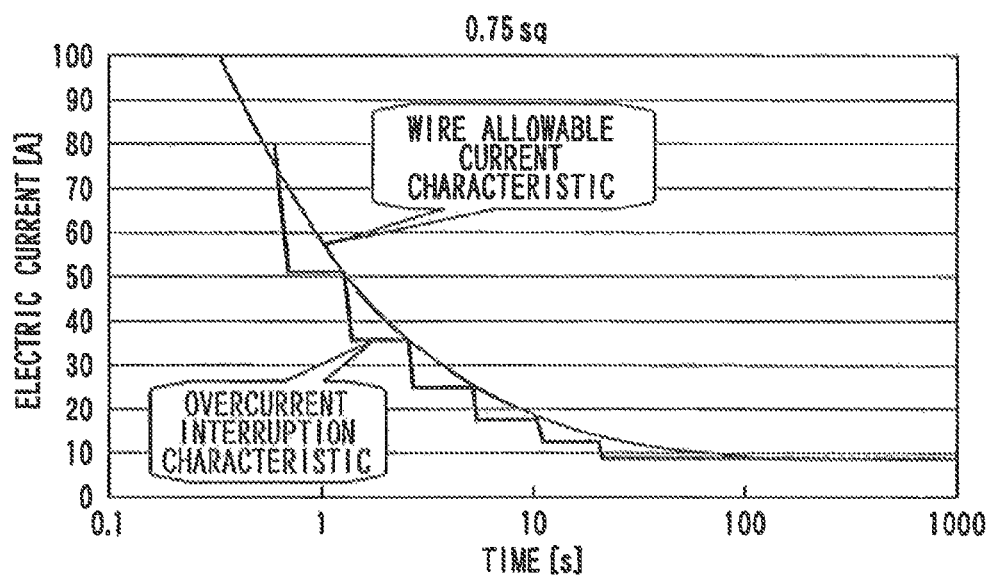
FIG. 13 is a diagram showing an overcurrent interruption characteristic of the electric current detection circuit according to the related art.

An example of an electric current detection circuit used for an overcurrent protection circuit is shown in FIG. 12. An electric current detection circuit 30 shown in FIG. 12 is a circuit that detects an electric current flowing to a plurality of loads 6a-6f.

A scheduling circuit 20 outputs a selection signal corresponding to a plurality of channels (ch1-ch6). The scheduling circuit 20 repeatedly outputs 3-bit selection signal corresponding to 0, 1, 2, 3, 4, 5 every 0.16 milliseconds (ms) from a counter circuit.

Selectors 31b-31h sequentially allow passage of voltages corresponding to electric currents flowing to semiconductor switches (SW) 10-15 to a plurality of comparators 32b-32h based on the selection signal transmitted from the scheduling circuit 20.

Between a reference voltage generation circuit ($V_{REF}$ GENERATION) 300x and the ground, resistors 39b-39h are coupled in series. The resistors 39b-39h divides a voltage (reference voltage) at a junction point of an analog switch 38 and the resistor 39b.

A junction point of the reference voltage generation circuit 300x and the resistor 39b is coupled with an inverting input terminal of the comparator 32b, and junction points of the resistors are respectively coupled with inverting input terminals of the comparators 32c-32h. In other words, the reference voltage is divided by the resistors 39b-39h, and the divided voltages are applied to the inverting input terminals of the comparators 32b-32h.

The electric current detection circuit 30 includes seven stages of the comparators 32b-32h having different current threshold values, and determines a current level of the electric current flowing into the loads 6a-6f.

The reference voltage generation circuit 300x receives signal that indicate line types of wires 8a-8f of the channels (ch1-ch6) from the selector 31j. The line types of the wires 8a-8f are classified into 0.5 sq, 0.75 sq, 0.8 g sq, and 1.25 sq in accordance with thickness.

The reference voltage generation circuit 300x generates a constant voltages (reference voltages) based on the signal transmitted from the selector 31j and outputs constant voltages (reference voltages) corresponding to respective channels (ch1-ch6) based on the selection signal transmitted from the scheduling circuit 20. The reference voltage generation circuit 300x changes the reference voltages in accordance with the line types of the wires 8a-8f. Accordingly, the current threshold values applied to the non-inverting input terminals of the comparators 32b-32h can be appropriately set.

Output signals of the comparators 32b-32h are respectively transmitted to AND circuits 33a-33g and the inverter 34. Because of the AND circuits 33a-33h and the inverter 34, a high level signal is output from only a comparators at which the electric current exceeds the current threshold value.

In the electric current detection circuit 30, the electric current flowing to the loads can be detected with accuracy by increasing the number of stage of comparators. Furthermore, when the electric current flowing into the loads is detected with accuracy, a square current value proportional to the detected current value can be calculated with accuracy, and the electric current flowing to the loads can be interrupted with overcurrent interruption characteristic along with wire allowable current characteristic.

However, because the electric current detection circuit 30 shown in FIG. 12 includes only seven comparators, a resolution is low, and overcurrent interruption characteristic has a stepwise shape. Thus, it is difficult to interrupt the electric current flowing to the loads with an ideal overcurrent interruption characteristic.

The resonance can be improved by increasing the number of comparators. However, in order to interrupt the electric currents flowing into the loads with an ideal overcurrent interruption characteristic, it is required to increase the number of comparator substantially, and a cost increases.

In view of the foregoing difficulties, embodiments of the present disclosure will be described below.

(First Embodiment)

An overcurrent protection circuit including an electric current detection circuit according to a first embodiment of the present disclosure will be described with reference to the accompanying drawings. The overcurrent protection circuit can be disposed, for example, in a vehicle, and can function as a power supply device that supplies electric power to loads coupled with a wire (wire harness). The overcurrent protection circuit detects an electric current flowing to the loads using the electric current detection circuit, calculates a square current value corresponding to detected current value, and interrupts the electric current when temperature rise corresponding value of the wire obtained from the square current value exceeds threshold value.

Figure 1:
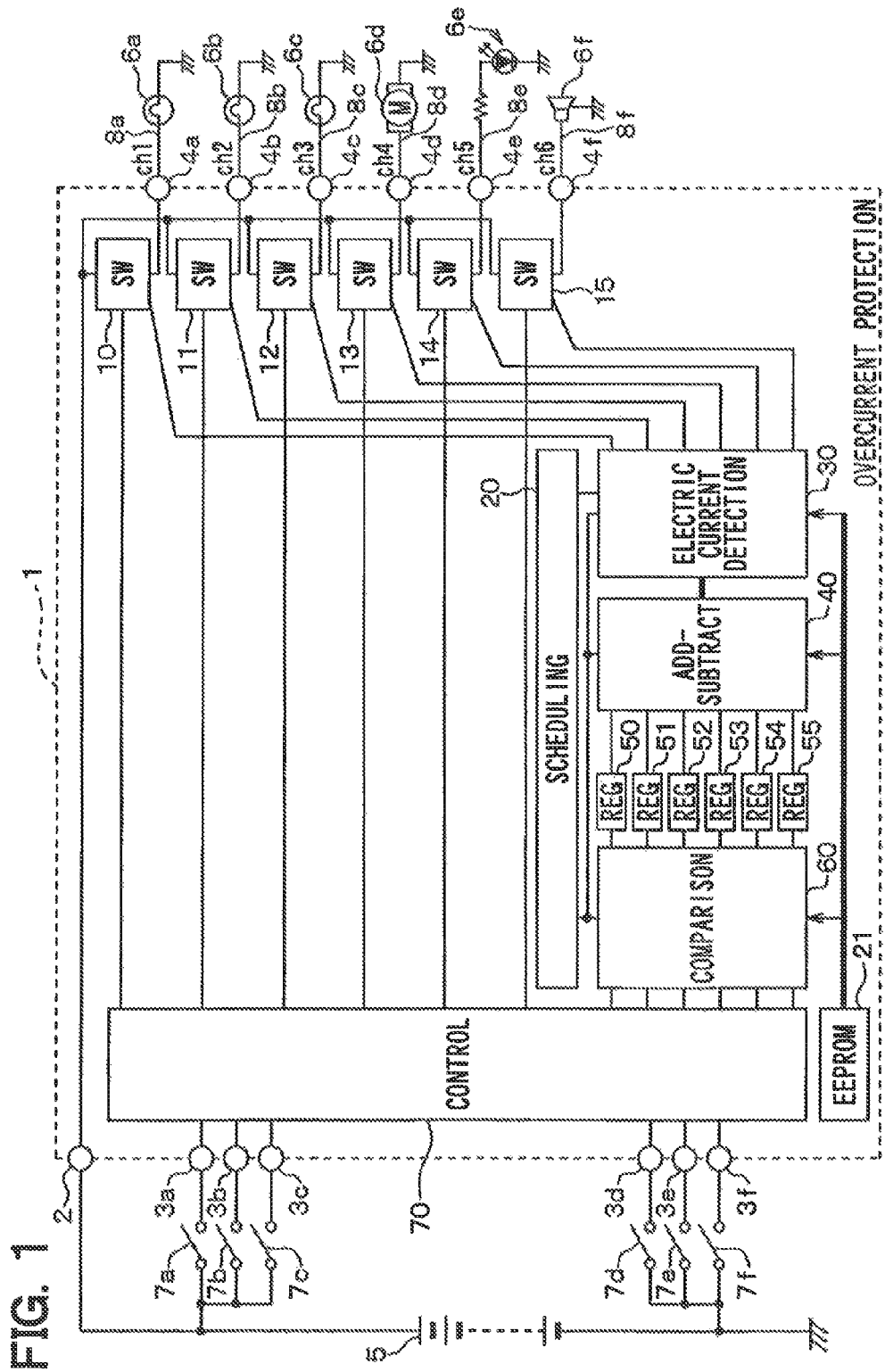
FIG. 1 is a diagram showing an overcurrent protection circuit including an electric current detection circuit according to a first embodiment of the present disclosure.

As shown in FIG. 1, the overcurrent protection circuit 1 includes a plurality of semiconductor switches (SW) 10-15, a scheduling circuit 20, an electrically erasable programmable read-only memory (EEPROM) 21, an electric current detection circuit 30, an add-subtract circuit 40, a plurality of registers (REG) 50-55, a comparison circuit 60, and a control circuit 70.

The overcurrent protection circuit 1 further includes a power source terminal 2, a plurality of input terminals 3a-3f, and a plurality of output terminals 4a-4f. The power source terminal 2 is coupled with a power source 5, and the power source 5 supplies electric power to the overcurrent protection circuit 1. The electric power is supplied to loads 6a-6f via output terminals 4a-4f.

A plurality of input terminals 3a-3f transmits command for driving one of the loads 6a-6f. The input terminals 3a-3f are respectively coupled with switches 7a-7f. When the switches 7a-7f are turned on, for example, the input terminals 3a-3c are at a power source potential and the input terminals 3d-3f are at a ground potential.

The output terminals 4a-4f are respectively coupled with the loads 6a-6f via the wires 8a-8f. Thus, the loads 6a-6f are respectively energized via the wires 8a-8f. Each of the loads 6a-6f may be, for example, a lamp, a motor, a light emitting diode (LED), or a horn. A diameter and a material of each of the wires 8a-8f may be selected in accordance with the coupled loads 6a-6a.

In the present embodiment, the output terminals 4a-4f of the overcurrent protection circuit 1 are called channels (ch). Because the overcurrent protection circuit 1 includes six output terminals 4a-4f as shown in FIG. 1, the overcurrent protection circuit 1 has six channels.

The semiconductor switches 10-15 are respectively coupled between the power source terminal 2 and the output terminals 4a-4f and respectively drive the loads 6a-6f. Each of the semiconductor switches 10-15 may include, for example, a power metal-oxide semiconductor field-effect transistor (power MOSFET), an insulated gate bipolar transistor (IGBT), or a bipolar transistor. When each of the semiconductor switches 10-15 is formed of an n-type MOSFET, drains of the semiconductor switches 10-15 are coupled with the power source terminal 2, and sources of the semiconductor switches 10-15 are respectively coupled with the output terminals 4a-4f. Gates of the semiconductor switches 10-15 are coupled with the control circuit 70.

The scheduling circuit 20 performs a time sharing control of the electric current detection circuit 30, the add-subtract circuit 40, and the comparison circuit 60 with respect to each of the loads 6a-6f. Accordingly, the channels ch1-ch6 can share the electric current detection circuit 30, the add-subtract circuit 40, and the comparison circuit 60.

Figure 3:
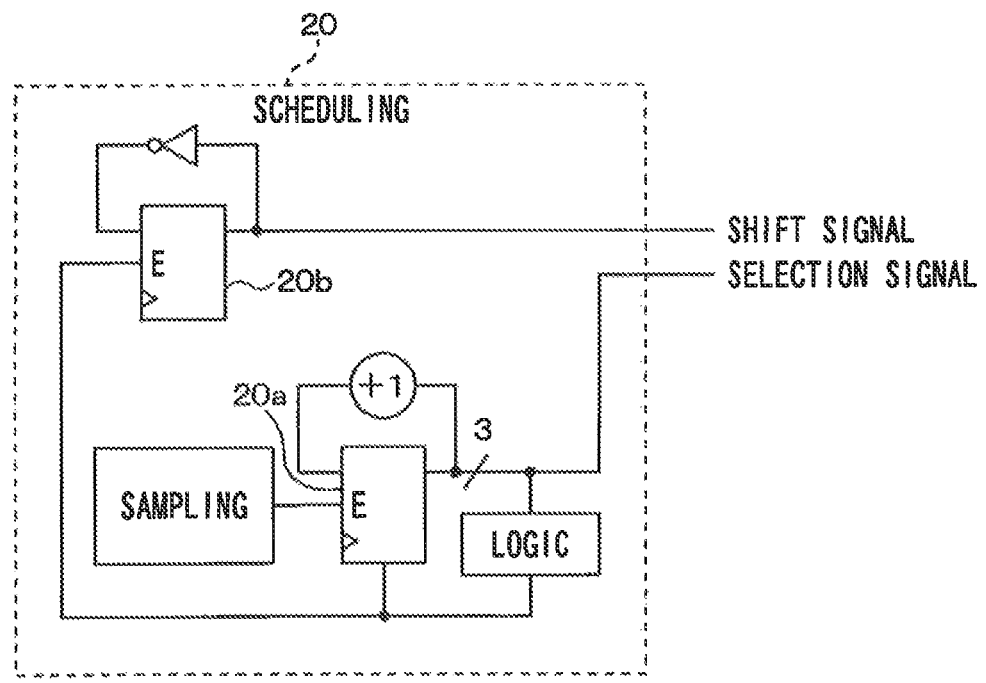
FIG. 3 is a diagram showing a scheduling circuit in the overcurrent protection circuit shown in FIG. 1.

As shown in FIG. 3, the scheduling circuit 20 includes a flip flop 20a so as to output signal with a fixed sampling period (for example, 0.18 ms). One is added to an output of the flip flop 20a, and a signal is output every 0.16 ms. Because the overcurrent protection circuit 1 has six channels (ch1-ch6), a signal corresponding to 0, 1, . . . , 5 is output every 0.16 ms. When a signal corresponding to 5 is output, the flip flop 20a is reset, and then a signal corresponding to 0 is output again.

Thus, the scheduling circuit 20 outputs a signal for changing the channel from ch1 to ch6 in 1 ms. For example, the signal corresponds to 0 indicates ch1, and the signal corresponding to 1 indicates ch2. Hereafter, the signal output from the flip flop 20a in the scheduling circuit 20 with the fixed sampling period is referred to as a selection signal.

In addition, the scheduling circuit 20 output a shift signal having a level inverted with a fixed period (for example, 1 ms). The scheduling circuit 20 further includes a flip flop 20b. Between an output terminal and an input terminal of the flip flop 20b, an inverter is coupled. When the flip flop 20a outputs the signal corresponding to 5, the flip flop 20b is reset in a manner similar to the flip flop 20a.

Figure 4:
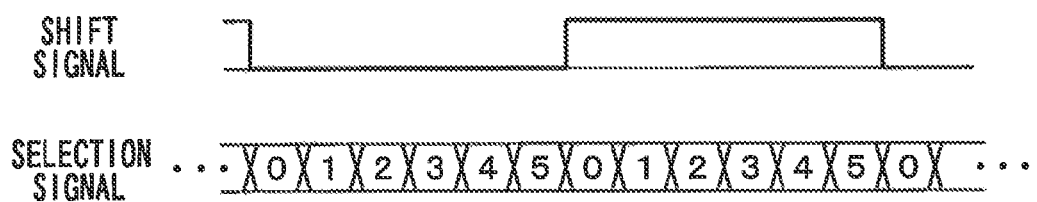
FIG. 4 is a diagram showing waveforms of a selection signal and a shift signal output from the scheduling circuit.

As shown in FIG. 4, the shift signal is inverted when the selection signal becomes 0, 1, ... 5. A period of the shift signal is, for example, 2 ms.

The EEPROM 21 shown in FIG. 1 is a memory that stores a predetermined determination value for determining an overcurrent and data about diameters and materials of the wires 8a-8f coupled with the output terminals 4a-4f, kinds of the loads 6a-6f, and a predetermined value described later. The EEPROM 21 outputs the data stored therein to the electric current detection circuit 30, the add-subtract circuit 40, and the comparison circuit 60.

Figure 2:
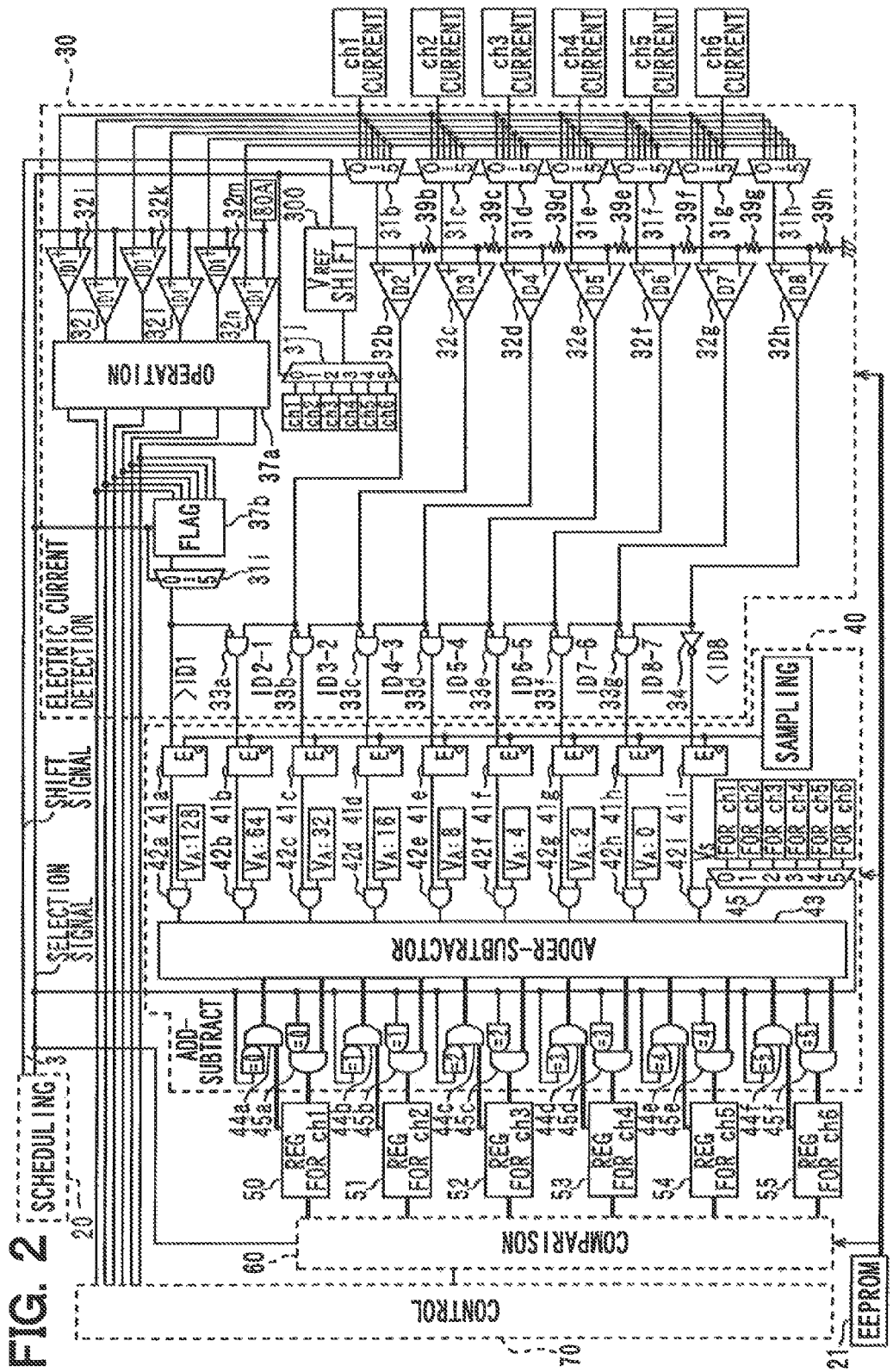
FIG. 2 is a diagram showing a part of the overcurrent protection circuit shown in FIG. 1.

As shown in FIG. 2, the electric current detection circuit 30 includes comparators 32i-32n, an ID1 detection time operation circuit (OPERATION) 37a, an ID1 detection time flag circuit (FLAG) 37b, selectors 31i, 31j, and a reference voltage shift circuit ($V_{REF}$ SHIFT) 300 in addition to selectors 31b-31h, comparators 32b-32h, AND circuits 33a-33g, and an inverter 34.

A non-inverting input terminal of the comparator 32i receives an electric current of ch1. Similarly, a non-inverting input terminal of the comparator 32j receives an electric current of ch2, a non-inverting input terminal of the comparator 32k receives an electric current of ch3, a non-inverting input terminal of the comparator 32l receives an electric current of ch4, a non-inverting input terminal of the comparator 32m receives an electric current of ch5, and a non-inverting input terminal of the comparator 32n receives an electric current of ch6. Inverting input terminals of the comparators 32i-32n receive a fixed (for example, 80 A) current threshold value (ID1). Each of the comparator 32i-32n compares a voltage corresponding to the electric current of each ch with the current threshold value ID1. A comparison result of each of the comparators 32i-32n is transmitted to the ID1 detection time operation circuit 37a.

The current threshold value (ID1) is a semiconductor switch allowable current value relating to the semiconductor switches 10-15.

The ID1 detection time operation circuit 37a transmits the comparison result of each of the comparators 32i-32n to the control circuit 70. The ID1 detection time flag circuit 37b sets a flag based on a command from the control circuit 70. For example, the ID1 detection time flag circuit 37b outputs a high signal when the flag is set and the ID1 detection time flag circuit 37b outputs a low signal when the flag is not set. The output signal of the ID1 detection time flag circuit 37b is transmitted to a flip flop 41a of the add-subtract circuit 40 via the selector 31i based on the selection signal transmitted from the scheduling circuit 20.

Figure 5:
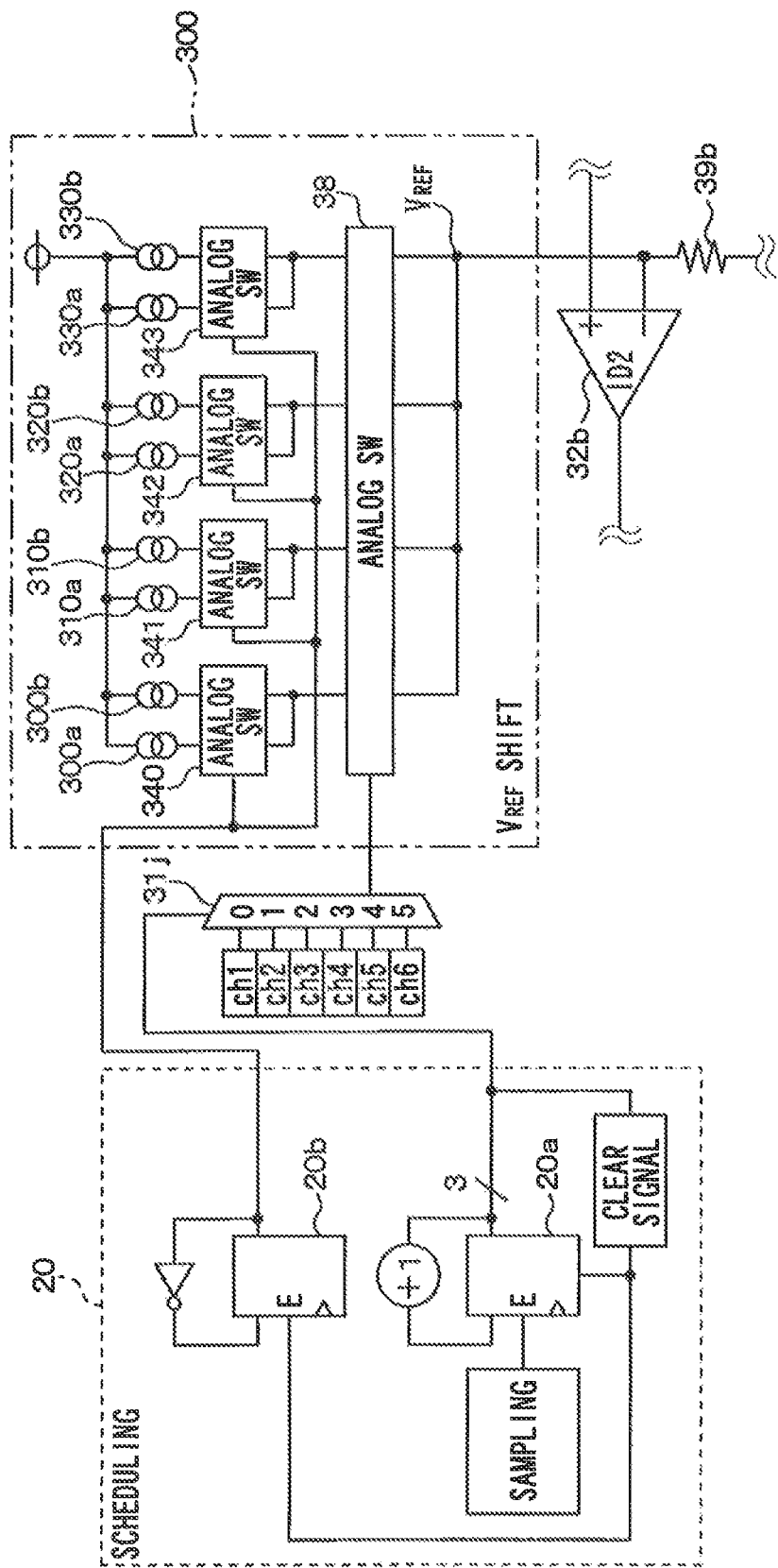
FIG. 5 is a diagram for explaining a detail configuration of a reference voltage shift circuit.

As shown in FIG. 5, the reference voltage shift circuit 300 includes a plurality of constant current source 300a, 300b, 310b, 320a, 320b, 330a, 330b, and analog switches (ANALOG SW) 340, 341, 342, 343, 38.

Between the analog switch 38 and the ground, resistors 39b-39h are coupled in series. The resistors 39b-39h form a voltage generation circuit that generates a plurality of different voltages by dividing a voltage (reference voltage $V_{REF}$) at a junction point of the analog switch 38 and the resistor 39b. The junction point of the analog switch 38 and the resistor 39b is coupled with the inverting input terminal of the comparator 32b. Junction point of each resistor is coupled with the inverting input terminal of corresponding one of the comparators 32c-32h. The comparators 32c-32h determine a current level of the electric currents flowing to the loads using the voltages generated by the resistors 39b-39h as threshold voltages.

The analog switch 340 switches based on the shift signal transmitted from the scheduling circuit 20 so that a constant current of one of the constant current source 300a and the constant current source 300b flows to the resistors 39b-39h. The analog switch 341 switches based on the shift signal transmitted from the scheduling circuit 20 so that a constant current of one of the constant current source 310a and the constant current source 310b flows to the resistors 39b-39h. The analog switch 342 switches based on the shift signal transmitted from the scheduling circuit 20 so that a constant current of one of the constant current source 320a and the constant current source 320b flows to the resistors 39b-39h. The analog switches 343 switches based on the shift signal transmitted from the scheduling circuit 20 so that a constant current of one of the constant current source 330a and the constant current source 330b flows to the resistors 39b-39h.

When the analog switches 340-343 switch based on the shift signal transmitted from the scheduling circuit 20, the voltage (reference voltage) of the inverting input terminal of the comparator 32b shifts. The electric current detection circuit 30 according to the present embodiment shifts the reference voltages, and determines the current level of electric current flowing into the loads 6a-6f based on the output signal of the comparators before shifting the reference voltage and the output signal of comparators after shifting the reference voltage.

The analog switch 38 is coupled with the selector 31j and receives the signal depending on the line types of the wires 8a-8f coupled with respective channels based on the selection signal transmitted from the scheduling circuit 20. Accordingly, the current value of the electric current flowing into the series circuit of the resistors 39b-39h changes, and the current threshold values set at the comparator 32b-32h are changed in accordance with the line types of the wires 8a-8f.

Each of the wires 8a-8f may be, for example, an AVSS line or an AVSSF and may have a width of, for example, 0.5 sq, 0.75 sq, 0.85 sq, or 1.25 sq. Because the wires 8a-8b have different characteristics, the current threshold values of the comparators 32b-32h are changed based on the line types of the wires 8a-8f.

An example of current threshold values of copper wire harnesses is shown in FIG. 6. The threshold values of the copper wire harnesses shown in FIG. 6 are current threshold values before shifting the reference voltage. As shown in FIG. 6, regardless of the line types of the wires 8a-8f, ID1 is set at the allowable energization current value (80 A) of the semiconductor switches 10-15. Based on the expression for calculating the detection current value shown in the right column in FIG. 6, the current threshold values depending on the thicknesses of the wires 8a-8f are set in accordance with the levels. For example, when a wire allowable current value is denoted by Z, the threshold values of the ID2-ID6 are values calculated by multiplying Z by predetermined values ($\sqrt{32}$ to $\sqrt{2}$). The current threshold value of ID7 is Z, and the current threshold value of ID8 is Z×0.95. In this way, the threshold values depending on the wires 8a-8f are respectively set.

FIG. 7 is a diagram showing a relationship between current threshold values and integration values before and after shifting at a setting 2 (line diameter 0.75 sq) in FIG. 6. The shifting of the reference voltage at the setting 2 is performed by switching the analog switch 341. Before shifting the reference voltage, the threshold values of ID1 to ID8 are 80 A, 50.9 A, 36 A, 25.5 A, 18 A, 12.7 A, 9 A, and 8.6 A, respectively. After shifting the reference voltage, the current threshold values of ID1 to ID7 are 80 A, 62.4 A, 44.1 A, 31.2 A, 22 A, 15.6 A, and 11 A, respectively. In other words, before shifting the reference voltage, the constant current flows from the constant current source 310a to the resistors 39b-39h, and the current threshold values are values before shifting shown in FIG. 7. After shifting the reference voltage, the constant current flows from the constant current source 310b to the resistors 39b-39h, and the current threshold values become values after shifting shown in FIG. 7.

In a case where the electric current flowing into the loads 6a-6f is, for example, 15 A and the reference voltage is not shifted, the output signal of the comparator 32f corresponding to ID6, which has the current threshold value less than 15 A, becomes the high level.

In a case where the reference voltage is shifted, the output signal of the comparator 32f corresponding to ID6 becomes the high level before shifting the reference voltage, and the output signal of the comparator 32g corresponding to ID7 becomes the high level after shifting the reference voltage.

In this way, from the determination result of the current level before shifting the reference voltage and the determination result of the current level after shifting the reference voltage, the current level can be detected in more detail. In other words, by shifting the current threshold values of the seven comparators 32b-32h, the current level can be determined as if fourteen comparators are used.

Furthermore, from the determination result of the current level before shifting the reference voltage and the determination result of the current level after shifting the reference voltage, the total integration value can be specified in more detail.

Figure 8:
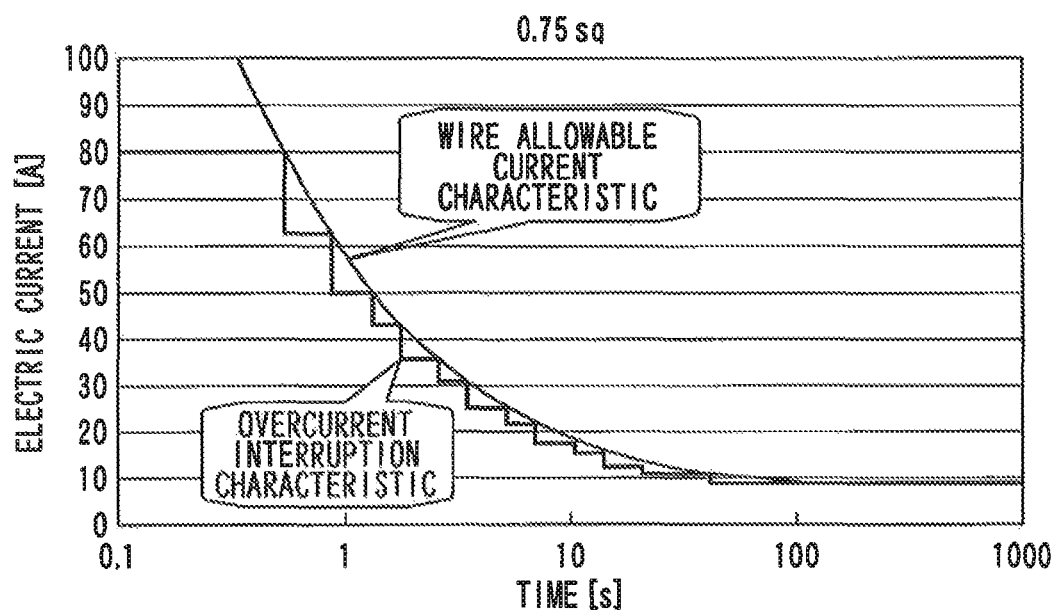
FIG. 8 is a diagram showing an overcurrent interruption characteristic of the electric current detection circuit according to the first embodiment.

As shown in FIG. 8, because the electric current detection circuit 30 can detect the electric current flowing to the loads 6a-6f with a high resolution, the electric current detection circuit 30 can specify the total integration value in more detail. Therefore, the overcurrent interruption characteristic of the overcurrent protection circuit 1 can approach the wire allowable current characteristic.

The add-subtract circuit 40 includes predetermined value selection circuits 42a-42i. In each of the predetermined value selection circuits 42a-42h, a predetermined additional value ($V_A$) is set. When the high signal is input from a corresponding one of the flip flops 41a-41h, each of the predetermined value selection circuit 42a-42h outputs the predetermined additional value to an adder-subtractor 43. The predetermined value selection circuit 42i outputs a subtraction value ($V_S$) set for each channel via a selector 45.

Thus, when the detection current value acquired at the present time is greater than a predetermined current value, the add-subtract circuit 40 adds the predetermined value depending on the detection value acquired at the present time to a calculation result using the predetermined value depending on the detection current value acquired at the last time. When the detection current value acquired at the present time is less than the predetermined current value, the add-subtract circuit 40 subtracts the predetermined value depending on the detection value acquired at the present time from the calculation result using the predetermined value depending on the detection current value acquired at the last time. The predetermined current value may be the wire allowable current value or a wire smoking current value.

As shown in FIG. 7, before shifting the reference voltage, when the detection current value (I) detected at the electric current detection circuit 30 is equal to or greater than 50.9 A and is less than 80 A, the additional value is set at 64. When the detection current value (I) is equal to or greater than 36 A and is less than 50.9 A, the additional value is set at 32. When the detection current value (I) is equal to or greater than 25.5 A and is less than 36 A, the additional value is set at 16. When the detection current value (I) is equal to or greater than 18 A and is less than 25.5 A, the additional value is set at 8. When the detection current value (I) is equal to or greater than 12.7 A and is less than 18 A, the additional value is set at 4. When the detection current value (I) is equal to or greater than 9 A and is less than 12.7 A, the additional value is set at 2. When the detection current value (I) is equal to or greater than 8.6 A and is less than 9 A, the additional value is set at 0.

After shifting the reference voltage, when the detection current value (I) detected at the electric current detection circuit 30 is equal to or greater than 62.4 A, the additional value (integration value) is set at 64. When the detection current value (I) detected at the electric current detection circuit 30 is equal to or greater than 44.1 A and is less than 62.4 A, the additional value is set at 32. When the detection current value (I) detected at the electric current detection circuit 30 is equal to or greater than 31.2 A and is less than 44.1 A, the additional value is set at 16. When the detection current value (I) detected at the electric current detection circuit 30 is equal to or greater than 22 A and is less than 31.2 A, the additional value is set at 8. When the detection current value (I) detected at the electric current detection circuit 30 is equal to or greater than 15.6 A and is less than 22 A, the additional value is set at 4. When the detection current value (I) detected at the electric current detection circuit 30 is equal to or greater than 11 A and is less than 15.6 A, the additional value is set at 2. When the detection current value (I) detected at the electric current detection circuit 30 is less than 11 A, the additional value is set at 0.

Thus, when the detection current value (I) detected by the electric current detection circuit 30 is equal to or greater than 62.4 A, the total integration value before and after shifting the reference voltage is 128. When the detection current value (I) is equal to or greater than 50.9 A and is less than 62.4 A, the total integration value before and after shifting the reference voltage is 96. When the detection current value (I) is equal to or greater than 44.1 A and is less than 50.9 A, the total integration value before and after shifting the reference voltage is 64. When the detection current value (I) is equal to or greater than 36 A and is less than 44.0 A, the total integration value before and after shifting the reference voltage is 48. In this way, by shifting the reference voltage, the total integration value can be specified in detail.

When the detection current value (I) detected by the electric current detection circuit 30 satisfies a relationship of ID8≤I<ID7, the additional value is 0. Thus, the add-subtract circuit 40 adds 0 as the additional value.

In case of the above-described addition, a common additional value is used for the channels (ch1-ch6).

At the predetermined value selection circuits 42a-42h, which correspond to cases where the detection current value detected by the overcurrent detection circuit is equal to or greater than ID6, only the additional values are set. Thus, when the detection current value acquired at the present time is greater than the predetermined current value (the wire allowable current value Z), the add-subtract circuit 40 adds the predetermined absolute value. In other words, the adder-subtractor 43 performs only addition.

In the present embodiment, when the detection current value is equal to or greater than ID1, the additional value is set at 128 as an example. The additional value may be other value. For example, when it is assumed that the semiconductor switches 10-15 are interrupted in 100 μs for protecting the semiconductor switches 10-15 when the detection current value ID1 is equal to or greater than 80 A, because the current detection for six channels is performed in 1 ms, 13 which is calculated from an expression of 128×(100 μs/1 ms) may also be used as an additional value.

When the detection value (I) detected by the electric current detection circuit 30 satisfies a relationship of I<ID 8, the subtraction value depending on the line types of the wires 8a-8f is set to the predetermined value selection circuit 42i. Thus, when the detection current value acquired at the present time is less than the predetermined current value (the wire allowable current Z), the add-subtract circuit 40 subtracts. In other words, the adder-subtractor 43 performs only subtraction.

In the present case, as shown in FIG. 7, −1 or −2 is set to each channel (ch1-ch6) as the subtraction value depending on the intended use. The selection of the subtraction value is previously stored in the EEPROM 21 and is read when the overcurrent protection circuit 1 operates.

The add-subtract circuit 40 shown in FIG. 2 adds and subtracts the predetermined value corresponding to the current value detected by the electric current detection circuit 30. The add-subtract circuit 40 performs calculation based on the detection current value for each of the loads 6a-6f, that is, for each of the channels (ch1-ch6).

The add-subtract circuit 40 includes the flip flops 41a-41i, the predetermined value selection circuits 42a-42i, the adder-subtractor 43, readout circuits 44a-44f, and writing circuits 45a-45f.

The flip flops 41a-41i output received high signals or low signals with a predetermined sampling period (for example, 0.16 ms). The flip flop 41a holds the output signal of the comparator 32a. The flip flops 41b-41h hold the output signals of the AND circuits 33a-33g, respectively. The flip flop 41i holds the output signal of the inverter 34.

When each of the predetermined value selection circuits 42a-42i receives the high signal from the corresponding one of the flip flops 41a-41i, each of the predetermined value selection circuits 42a-42i outputs the predetermined value depending on a detection current range to the adder-subtractor 43.

When the detection current value acquired at the present time is greater than the predetermined current value, the adder-subtractor 43 adds the predetermined value depending on the detection value acquired at the present time to the calculation result using the predetermined value depending on the detection current value acquired from the electric current detection circuit 30 at the last time. When the detection current value acquired at the present time is less than the predetermined current value, the adder-subtractor 43 subtracts the predetermined value depending on the detection value acquired at the present time from the calculation result using the predetermined value depending on the detection current value acquired from the electric current detection circuit 30 at the last time.

Figure 9:
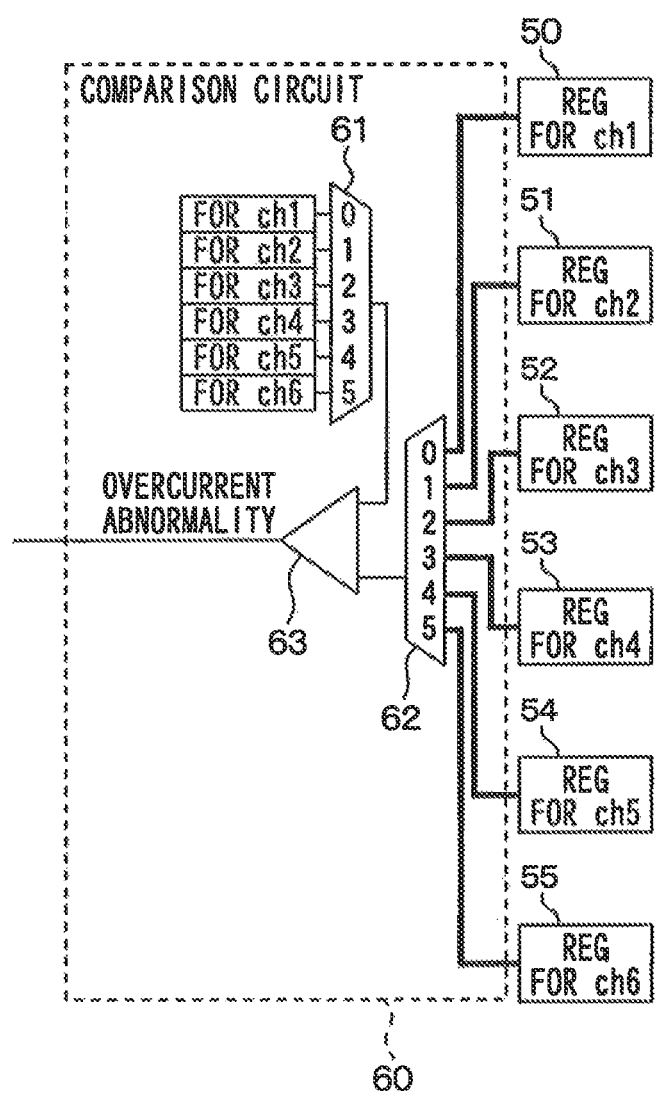
FIG. 9 is a diagram showing a comparison circuit.

The comparison circuit 60 compares a determination threshold value for determining whether overcurrent flows or not and the calculation result of the add-subtract circuit 40 with respect to each channel. As shown in FIG. 9, the comparison circuit 60 includes two selectors 61, 62, and the comparator 63.

The selector 61 outputs the determination threshold value set for each channel based on the selection signal transmitted from the scheduling circuit 20. The determination threshold values are stored in the EEPROM 21. The selector 62 outputs the calculation result stored in each of the registers 50-55 to the comparator 63 based on the selection signal transmitted from the scheduling circuit 20.

When the calculation result of the add-subtract circuit 40 transmitted from the selector 62 is greater than the determination threshold value transmitted from the selector 61, the comparator 63 determines that an overcurrent flows and outputs a high signal. As described above, the selectors 61, 62 output the determination threshold value (hereafter, referred to as a first determination threshold value) and the calculation result corresponding to the channel indicated by the selection signal based on the selection signal transmitted from the scheduling circuit 20. Thus, the comparator 63 compares the first determination threshold value set for each channel and the calculation result from ch1 to ch6 in order.

As shown in FIG. 1, the control circuit 70 turns on and off the semiconductor switches 10-15 based on input conditions. The input conditions include that any one of the switches 7a-7f is turned on and the comparison result indicating a detection of overcurrent is transmitted from the comparison circuit 60. In other words, when the calculation result of the add-subtract circuit 40 is greater than the first determination threshold value and the comparison circuit 60 transmits the high signal, the control circuit 70 turns off the semiconductor switches 10-15. Accordingly, the wires 8a-8f are protected against the overcurrent.

The control circuit 70 further has a second determination threshold value that is smaller than the first determination threshold value. When the calculation result of the add-subtract circuit 40 reaches the second determination threshold value, the control circuit 70 turns on the semiconductor switches 10-15 again. Accordingly, when the overcurrent stops flowing to the wires 8a-8f, the loads 6a-7f operate again. Even if the semiconductor switches 10-15 are turned off, the semiconductor switches 10-15 are tuned on after a predetermined time. Thus, the operations of the loads 6a-6f, which are interrupted once, can be restarted.

In FIG. 2, the comparator 63 compares the first determination threshold value and the total value of addition and subtraction. The comparison of the second determination threshold value and the total value of addition and subtraction can be performed with a comparator which is not shown.

An operation of the overcurrent protection circuit 1 will be described. The overcurrent protection circuit 1 has six channels. However, an operation of the overcurrent protection circuit 1 with respect to one channel will be described below as an example, because the channels ch1-ch6 are switched by the scheduling circuit 20 with the predetermined sampling period and the operations of the overcurrent protection circuit 1 with respect to the channels ch1-ch6 are similar to each other. The one channel is, for example, a headlamp.

When the switches 7a-7f are operated and the control circuit 70 turns on the desired semiconductor switches 10-15, a rush current flows to the loads. The electric current detection circuit 30 outputs the detection result corresponding to a value of the rush current to the add-subtract circuit 40. When the detection current value acquired at the present time is greater than the predetermined current value, the add-subtract circuit 40 adds the predetermined value depending on the detection value acquired at the present time to the calculation result using the predetermined value depending on the detection current value acquired at the last time. When the detection current value acquired at the present time is less than the predetermined current value, the add-subtract circuit 40 subtracts the predetermined value depending on the detection value acquired at the present time from the calculation result using the predetermined value depending on the detection current value acquired at the last time.

The rush current becomes a large current instantaneously and decreases drastically. Thus, the value of electric current detected by the electric current detection circuit 30 drastically decreases with time. The total value of addition and subtraction increases after the rush current flows. However, after a predetermined time has elapsed, the subtraction value becomes greater than the additional value, and the total value of the addition and subtraction becomes 0 eventually.

When a steady load current flows, the total value of addition and subtraction does not exceed the first determination threshold value. Thus, the comparison circuit 60 does not determine that an overcurrent flows, and the control circuit 70 does not turn off the semiconductor switches 10-15.

In contrast, when an overcurrent flows to the wires 8a-8f, a large current keeps flowing differently from cases where the rush current flows. Therefore, the total value of addition and subtraction keeps increasing as long as the overcurrent keeps flowing, and the total value of addition and subtraction exceeds the first determination threshold value. Accordingly, the control circuit 70 turns off the semiconductor switches 10-15.

Accordingly, the electric current stops flowing to the wires 8a-8f, and the load current becomes 0. The electric current detection circuit 30 keeps detecting the electric current of 0, the subtraction value becomes greater than the additional value. Thus, substantially, the constant subtraction value is subtracted from the calculation result at the last time.

When the total value of addition and subtraction reaches the second determination threshold value as a result of subtracting the constant subtraction value from the calculation result at the last time, the control circuit 70 turns on the semiconductor switches 10-15 again. Then, the electric current flows to the wires 8a-8f again. If the electric current is the overcurrent, the total value of addition and subtraction exceeds the first determination threshold value again, and the semiconductor switches 10-15 are turned off.

After that, the total value of addition and subtraction reaches the second determination threshold value, and the semiconductor switches 10-15 are turned on. However, because the overcurrent flows to the wires 8a-8f, the total value of addition and subtraction exceeds the first determination threshold value, and the semiconductor switches 10-15 are turned off. The above-described processes are repeated.

In the present embodiment, when the total value of addition and subtraction reaches the second determination threshold value, the operation of turning on the semiconductor switches 10-15 again (retry operation) and the operation of keeping the semiconductor switches 10-15 being off (latch operation) can be selected by the EEPROM 2.

The overcurrent protection circuit 1 detects an overcurrent as described above to protect the wires 8a-8f and the loads 6a-6f. The overcurrent protection circuit 1 performs the above-described operation for each channel with the fixed sampling period.

The electric current detection circuit 30 according to the present embodiment includes the reference voltage shift circuit 300 that shifts the reference voltage and detects the electric current flowing to the loads 6a-6f based on the current level determined by the comparators 32b-32h before shifting the reference voltage and the current level determined by the comparators 32b-32h after shifting the reference voltage. Thus, the electric current detection circuit 30 can detect the electric current flowing to the loads 6a-6f with a high resolution without increasing the number of comparators.

(Second Embodiment)

Figure 10:
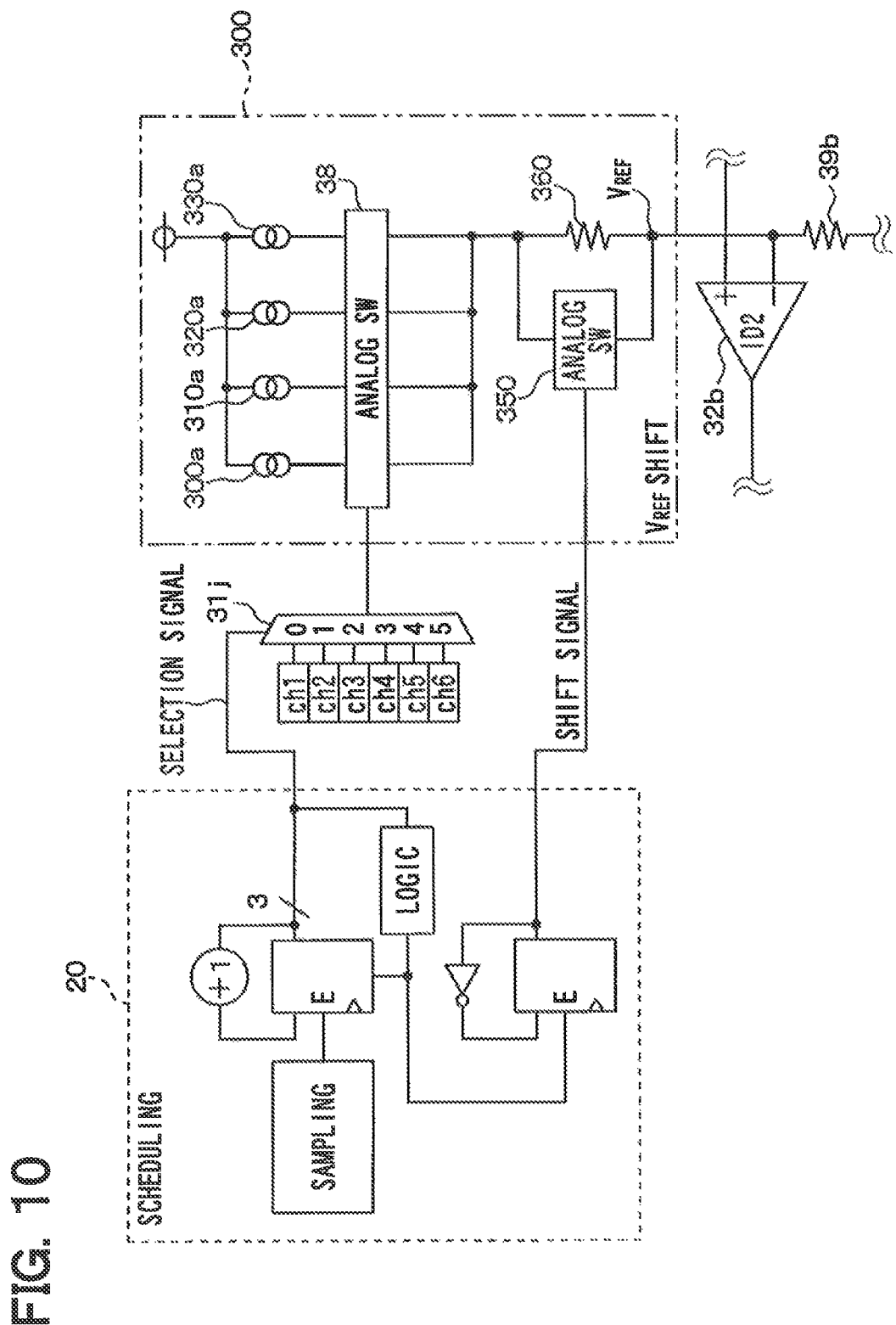
FIG. 10 is a diagram showing an electric current detection circuit according to a second embodiment.

A reference voltage shift circuit 300 according to a second embodiment of the present disclosure will be described with reference to FIG. 10. Description of parts of the second embodiment, which are substantially same as the corresponding parts of the first embodiment and are denoted by the same reference numerals, may be omitted. Parts of the second embodiment different from the parts of the first embodiment will be mainly described. In the first embodiment, the reference voltage between the analog switch 340 and the resistor 39b is shifted by switching the constant current source 300a and the constant current source 310b with the analog switch 340, and the electric current flowing to the loads 6a-6f is detected based on the current level determined by the comparators 32b-32h before shifting the reference voltage and the current level determined by the comparators 32b-32h after shifting the reference voltage. The reference voltage shift circuit 300 according to the present embodiment includes a level shift resistor 360 and an analog switch 350. The level shift resistor 360 is coupled between the analog switch 38 and the resistors 39b-39h and is coupled in series with the resistors 39b-39h. The analog switch 350 is coupled in parallel with the level shift resistor 360. The analog switches 350 connects and disconnects both ends of the level shift resistor 360 based on the shift signal (corresponding to the control signal) generated by the scheduling circuit 20. The reference voltage between the resistor 360 and the resistor 39b is shifted by turning on and off the analog switch 350.

The electric current flowing to the loads 6a-6f is detected based on the current level determined by the comparators 32b-32h before shifting the reference voltage and the current level determined by the comparators 32b-32h after shifting the reference voltage. Thus, the electric current detection circuit 30 can detect the electric current flowing to the loads 6a-6f with a high resolution without increasing the number of comparators.

(Third Embodiment)

Figure 11:
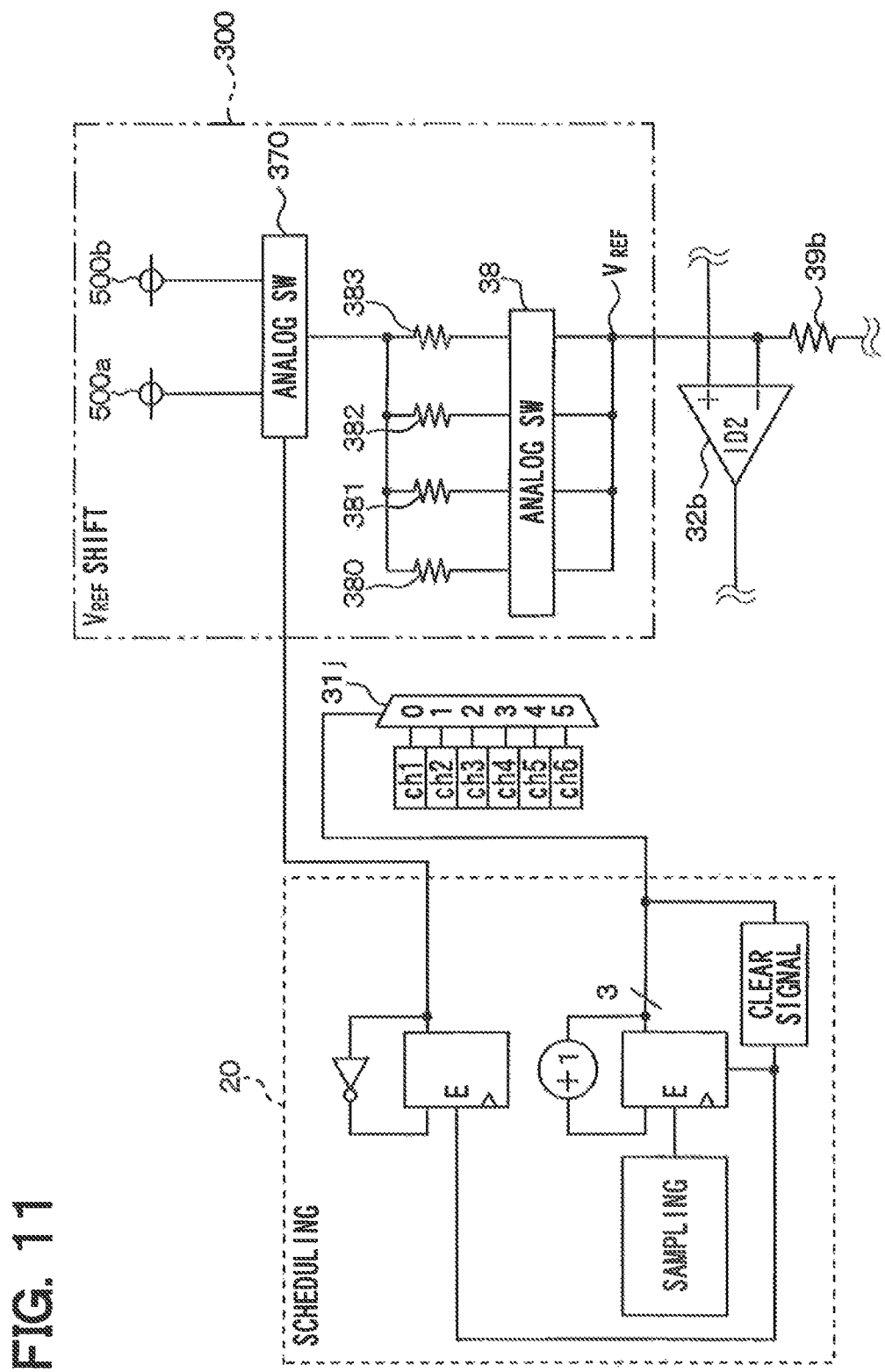
FIG. 11 is a diagram showing an electric current detection circuit according to a third embodiment.

A reference voltage shift circuit 300 according to a third embodiment of the present disclosure will be described with reference to FIG. 11. The reference voltage shift circuit 300 includes resistors 380, 381, 382, 383, and an analog switch 370. The resistors 380, 381, 382, 383 supply constant voltages to the resistors 39b-39h. The analog switch 370 is coupled between power sources 500a, 500b having different voltages and the resistors 39b-39h. The analog switch 370 switches the voltage applied to the resistors 39b-39h via the resistors 380, 381, 382, 383 based on the shift signal (the control signal). The analog switch 370 periodically switches the voltage applied to the resistors 39b-39h so as to shift the reference voltage between the analog switch 370 and the resistor 39b.

The electric current flowing to the loads 6a-6f is detected based on the current level determined by the comparators 32b-32h before shifting the reference voltage and the current level determined by the comparators 32b-32h after shifting the reference voltage. Thus, the electric current detection circuit 30 can detect the electric current flowing to the loads 6a-6f with a high resolution without increasing the number of comparators.

(Other Embodiments)

In the first to third embodiments, the current detection circuit 30 is used for the overcurrent protection circuit 1 that protects the loads 6a-6f by interrupting the electric current flowing to the loads 6a-6f, as an example. The current detection circuit 30 may also be used for other circuit.

In the first to third embodiments, the reference voltage is shifted in 2 stages as an example. By shifting the reference voltage in more stages, the resolution can be further increased.

In the above-described embodiments, the analog switches 340-343, 350, 370, which are switched based on the shift signal, are used as switching sections. An element other than an analog switch, such as a switching transistor and a relay may also be used as a switching section.

What is claimed is:

1. An electric current detection circuit for detecting an electric current flowing to each of a plurality of loads, comprising:
   a voltage generation circuit including a plurality of resistors coupled in series, and generating a plurality of different voltages by dividing a reference voltage with the plurality of resistors;
   a plurality of comparators determining a current level of the electric current flowing to each of the plurality of loads using the voltages generated by the voltage generation circuit as threshold values;
   a reference voltage shift circuit shifting the reference voltage;
   a selection section selecting one of the plurality of loads; and
   a signal output section outputting a selection signal to select each of the plurality of loads sequentially at a predetermined sampling period, and outputting a shift signal whose level is inverted each time all of the plurality of loads have been selected,
   wherein the electric current flowing to each of the plurality of loads is detected based on the current level determined by the plurality of comparators before shifting the reference voltage and the current level determined by the plurality of comparators after shifting the reference voltage,
   wherein the selection section selects each of the plurality of loads sequentially based on the selection signal so as to allow the plurality of comparators to determine the current level of the electric current flowing sequentially to each of the plurality of loads, and
   wherein the reference voltage shift circuit periodically shifts the reference voltage based on the shift signal.

2. The electric current detection circuit according to claim 1, wherein the reference voltage shift circuit includes:
   a plurality of constant current sources having difference current values; and
   a switching section coupled between the plurality of constant current sources and the plurality of resistors and periodically switching a constant current flowing to the plurality of resistors based on the shift signal so as to shift the reference voltage between the switching section and the plurality of resistors.

3. The electric current detection circuit according to claim 1, wherein the reference voltage shift circuit includes:
   a level shift resistor coupled between a power source terminal and the plurality of resistors and coupled in series with the plurality of resistors; and
   a switching section coupled in parallel with the level shift resistor and periodically connecting and disconnecting both ends of the level shift resistor based on a control the shift signal so as to shift the reference voltage between the level shift resistor and the plurality of resistors.

4. The electric current detection circuit according to claim 1, further comprising:
   a constant current source supplying a constant current to the plurality of resistors; and
   a switching section coupled between a plurality of power source terminals having different voltages and the plurality of resistors, and periodically switching a voltage applied to the plurality of resistors via the constant current source based on the shift signal so as to shift the reference voltage between the switching section and the plurality of resistors.

* * * * *